United States Patent [19]

Oishi et al.

[11] Patent Number: 5,655,954
[45] Date of Patent: Aug. 12, 1997

[54] POLISHING APPARATUS

[75] Inventors: Toshio Oishi, Numazu; Shoichi Shin, Tagata-gun; Masafumi Tsunada, Numazu; Masahiro Ishida; Yasukazu Mase, both of Yokohama, all of Japan

[73] Assignees: Toshiba Kikai Kabushiki Kaisha, Tokyo-to; Kabushiki Kaisha Toshiba, Kawasaki, both of Japan

[21] Appl. No.: 564,520

[22] Filed: Nov. 29, 1995

[30] Foreign Application Priority Data

Nov. 29, 1994 [JP] Japan .................................. 6-295160
Nov. 29, 1994 [JP] Japan .................................. 6-295163

[51] Int. Cl.$^6$ .................................. B24B 7/00; B24B 9/00
[52] U.S. Cl. .................................. 451/67; 451/287; 451/288; 451/289; 451/66; 134/62
[58] Field of Search .................................. 457/66, 67, 457, 457/41, 287, 288, 289, 334; 134/62, 902, 287–289, 41, 66, 67

[56] References Cited

U.S. PATENT DOCUMENTS

| | | | |
|---|---|---|---|
| 4,350,954 | 9/1982 | Basi | 134/2 |
| 5,213,118 | 5/1993 | Kamikawa | 134/902 |
| 5,299,584 | 4/1994 | Miyazaki et al. | 134/56 R |
| 5,329,732 | 7/1994 | Karlsrud et al. | 451/334 |
| 5,333,413 | 8/1994 | Hashimoto | 451/334 |
| 5,421,768 | 6/1995 | Fujiwara et al. | 451/288 |
| 5,425,793 | 6/1995 | Mori et al. | 55/385.2 |
| 5,456,627 | 10/1995 | Jackson et al. | 451/67 |
| 5,498,294 | 3/1996 | Matsushita et al. | 134/6 |
| 5,518,542 | 5/1996 | Matsukawa et al. | 134/902 |

*Primary Examiner*—Robert A. Rose
*Assistant Examiner*—George Nguyen
*Attorney, Agent, or Firm*—Cushman Darby & Cushman IP Group of Pillsbury Madison & Sutro, LLP

[57] ABSTRACT

Provided is a polishing apparatus which comprises a polishing mechanism for polishing a wafer taken out from a cassette, an attaching-detaching device for attaching to and detaching the wafer from the polishing mechanism, a device for cleaning the polished wafer, and a transportation device for transporting the wafer between the cassette, polishing mechanism, attaching-detaching device, and cleaning device. These devices are arranged individually in compartments. A working chamber is divided into a plurality of compartments by means of partitioning devices. A device for polishing a workpiece is set in one of the compartments. The apparatus is also provided with communication devices for internally connecting the adjacent compartments which are divided by the partitioning devices. The apparatus may further comprise devices for individually controlling the respective internal pressures of the compartments or a device for generating an air flow in the form of a laminar flow in each of the compartments.

21 Claims, 8 Drawing Sheets

POLISHING APPARATUS

BACKGROUND OF THE INVENTION

1. Field of the Invention

The present invention relates to a polishing apparatus used in a working semiconductor device, and more particularly, to a polishing apparatus which can automatically perform processes including wafer polishing, washing, and drying.

2. Information of the Related Art

A polishing apparatus is an apparatus which presses a wafer against an abrasive cloth attached to a base, for example, thereby working the wafer so that it has a specular surface. The single-sided polishing technique, which has conventionally been used in semiconductor manufacturing processes, is applied to the modern field of working semiconductor devices. This applied technique is called a chemical mechanical polishing (CMP) technique, and polishing apparatuses which use this technique are called CMP apparatuses.

Conventionally, many of the polishing apparatuses of this type have no cleaning-drying device therein. Normally, in these apparatuses, polished wafers are stored in a cassette in a separately provided water tank. In cleaning and drying the wafers, an operator takes the device out of the water tank, and carries them to a cleaning-drying device. In one such conventional polishing apparatus, a base section on which each wafer is held by means of a top ring is polished, a loader section for attaching and detaching the wafer, and a cleaning section for cleaning the surface of the top ring are arranged in different positions, and the top ring is moved between these three positions of operation. The apparatus may also comprise exclusive-use devices for centering and reversing the wafer in mounting it on the top ring, for example.

According to the conventional CMP apparatuses arranged in this manner, centering and reversing the wafer require the exclusive-use devices, and frequent rotating operation of the top ring entails extra machining time. Since the polishing apparatus is arranged independently of the cleaning-drying device, moreover, dripping during transportation or the like makes it hard to set the CMP apparatus in a clean room, so that the production line is complicated.

Since plenty of particles are produced when wafers are polished by means of the polishing apparatus of this type, the apparatus cannot be installed in an ordinary clean room. Accordingly, the conventional polishing apparatus is set in a separate room whose cleanness is lower than that of the normal clean room. In this arrangement, the wafers in the clean room are carried into the separate room, worked and cleaned by means of the polishing apparatus, and then returned to the clean room to start the next stage.

If the polishing apparatus is set in the separate room in this manner, the general flow of the semiconductor manufacturing processes stagnates during the use of the polishing apparatus, thus constituting a substantial hindrance to the automation of the manufacturing processes. Also, the use of the separate room entails extra costs, and besides, each wafer must be cleaned every time it is delivered from the low-cleanness separate room into the high-cleanness clean room.

SUMMARY OF THE INVENTION

A first object of the present invention is to provide a polishing apparatus capable of performing a series of processes including wafer polishing, cleaning, and drying.

A second object of the invention is to provide a polishing apparatus capable of a polishing operation such that a cassette stored with wafers can be kept in a normal dry state, whereby the apparatus can be installed in a clean room.

A third object of the invention is to provide a polishing apparatus in which movement of particles from a low-cleanness compartment, especially a compartment which contains means for polishing a workpiece, to a high-cleanness compartment can be restricted so that the apparatus can be installed in a clean room.

In order to achieve the first object, a polishing apparatus in a first aspect of the invention comprises polishing means for polishing a wafer taken out from a cassette, attaching the wafer-detaching means for attaching to and detaching the wafer from the polishing means, cleaning means for cleaning the polished wafer, and transportation means for transporting the wafer between the cassette, polishing means, attaching-detaching means, and cleaning means, the several means being arranged individually in compartments.

Thus, the series of processes, including wafer polishing, cleaning, and drying, can be performed. Wafer centering and reversal require no use of exclusive devices, and machining takes no extra time.

In order to achieve the second object, a polishing apparatus in a second aspect of the invention comprises first transportation means for taking a wafer out of a cassette and storing the wafer in the cassette after the wafer is cleaned and dried, polishing means for polishing the wafer by means of an abrasive cloth, a loader device for attaching the wafer to and detaching the wafer from the polishing means, cleaning-drying means for cleaning and drying the polished wafer, second transportation means for transporting the wafer taken out by the first transportation means to the loader device and also transporting the polished wafer from the loader device to the cleaning-drying means, and a dressing device for the abrasive cloth, the several means being arranged individually in compartments.

Thus, clean dry wafers are handled by means of the multifunctional first transportation means, while wet polished wafers are transported by means of the second transportation means. Accordingly, all the processes of the polishing operation can be performed and efficiently automated without soiling the wafers stored in the cassette. Since the loader device is provided with the cleaning means as well as loader means, moreover, the time required for the movement of the top ring can be shortened, so that the operating efficiency of the polisher can be improved. Since an appropriate measure is taken to counter diffusion of particles caused by the wafers' dripping during the transportation and the like, the CMP apparatus can be installed in a clean room.

In order to achieve the third object, a polishing apparatus in a third aspect of the invention comprises a working chamber divided into a plurality of compartments by partitioning means, means for polishing a workpiece set in one of the compartments, and communication means for internally connecting the adjacent compartments divided by the partitioning means.

Thus, the working chamber is divided into a plurality of compartments by means of the partitioning means, and the means for polishing the workpiece is located in one of the compartments. Accordingly, particles are restrained from moving from a low-cleanness compartment, especially the one which contains the polishing means, to a higher-cleanness compartment. In moving a wafer between the compartments, the compartments are made to communicate with one another by means of the communication means attached to the partitioning means. Moreover, the respective internal pressures of the compartments can be individually controlled depending on the cleanness of each compartment so that the higher the cleanness, the higher the pressure. Even when the compartments communicate with one another, therefore, the air flow between each two adjacent compartments is directed from the compartment with a higher cleanness to the one with a lower cleanness. Accordingly, plenty of particles in a low-cleanness compartment cannot flow into a higher-cleanness compartment. Further, the diffusion of the particles can be restrained by producing air flows in the individual compartments.

DETAILED DESCRIPTION OF THE PREFERRED EMBODIMENTS

A CMP apparatus according to a first embodiment of the present invention will now be described with reference to the accompanying drawings of FIGS. 1 to 6.

Figure 1:
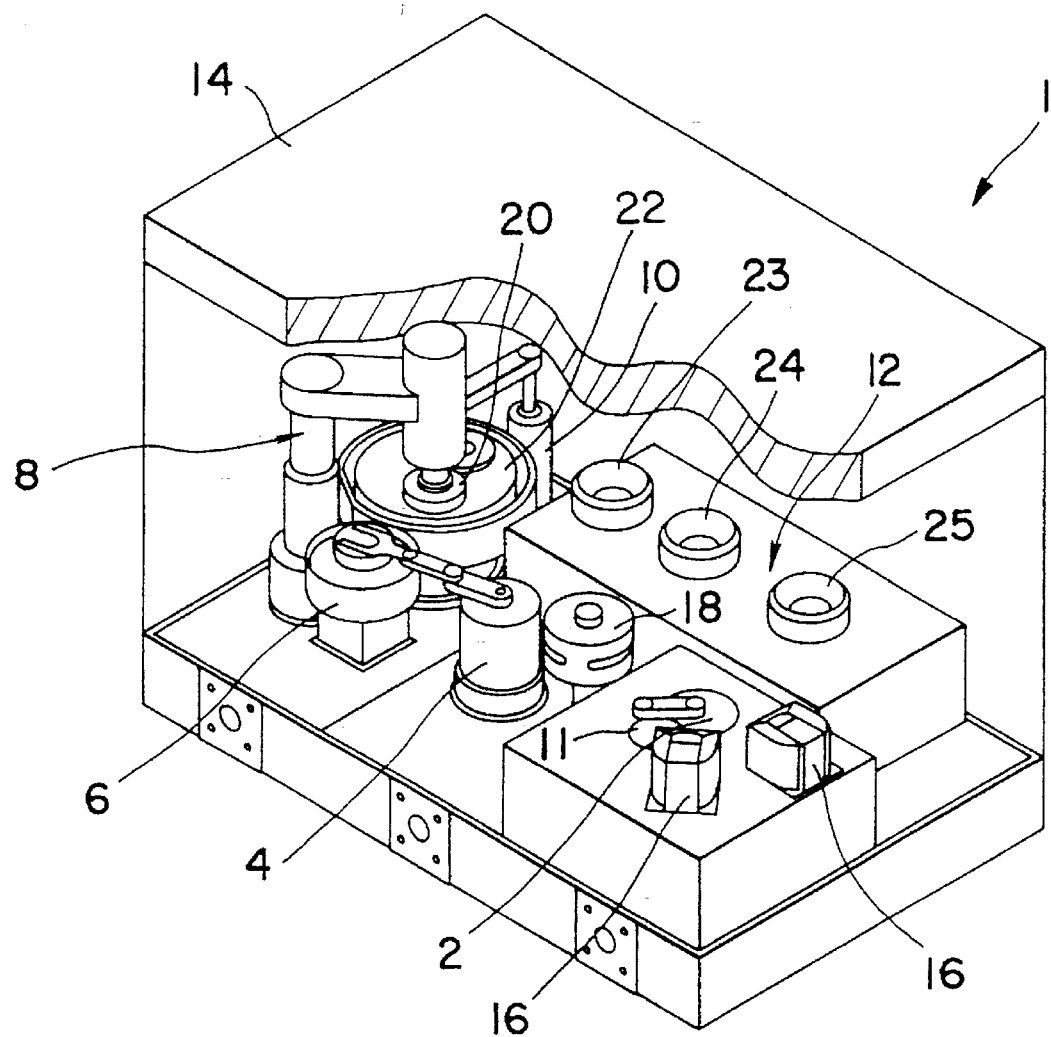
FIG. 1 is a schematic view showing a CMP apparatus according to a first embodiment of the present invention.
Figure 2:
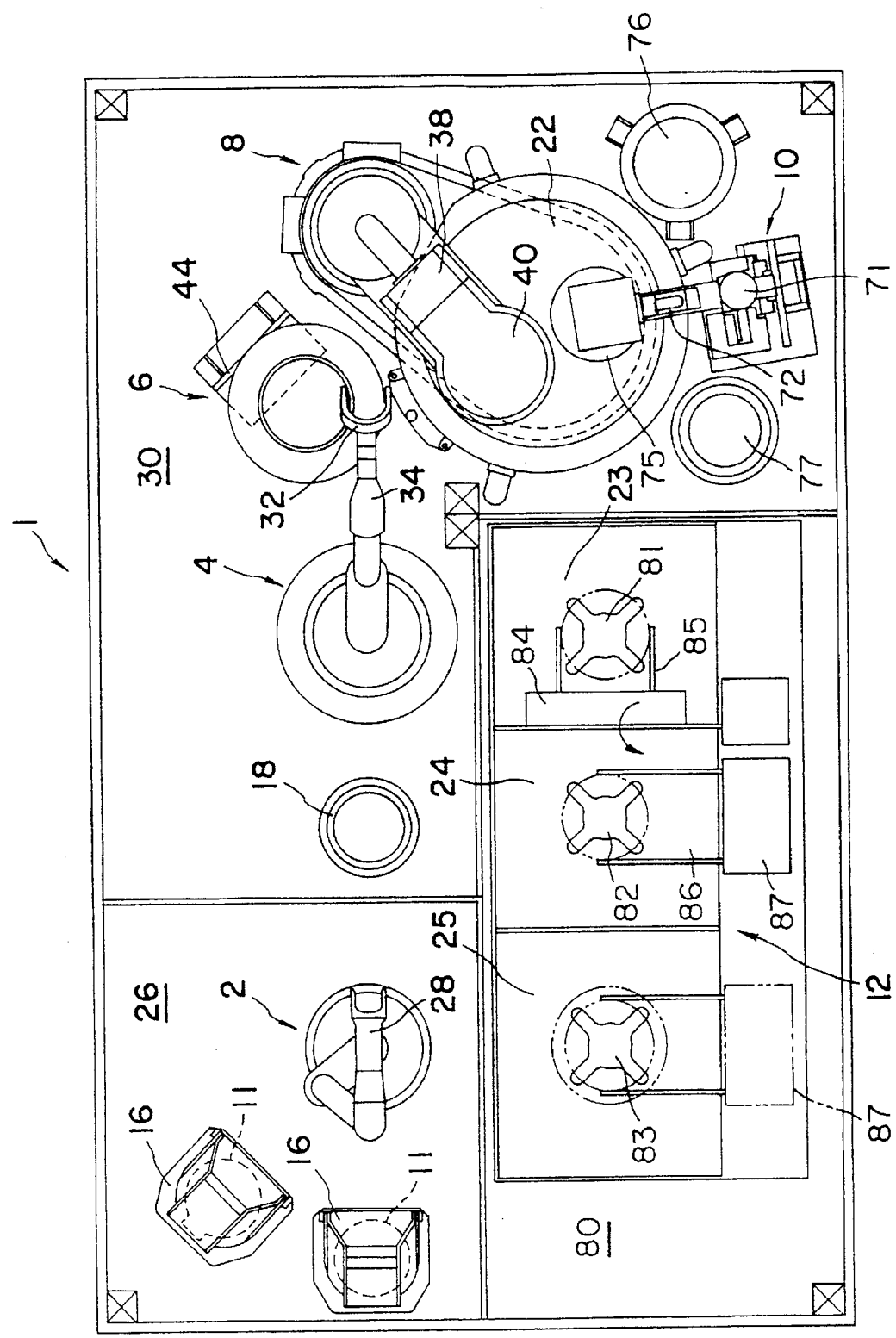
FIG. 2 is a plan view showing a layout of various devices of the CMP apparatus of FIG. 1.

FIG. 1 shows an outline of the CMP apparatus 1 according to the present embodiment of the invention, and FIG. 2 is a plan view showing a layout of various devices which constitute the apparatus 1. The CMP apparatus 1 comprises a first robot 2 which constitutes wafer transportation means, second robot 4, loader device 6, polisher 8, dressing device 10, cleaning-drying device 12, etc. These devices are arranged individually in compartments which are defined in a clean bench 14. Each compartment of the clean bench 14 is adjusted to its optimum pressure by means of an exclusive-use clean unit. Each two adjacent compartments between which wafers are delivered are divided by means of a gate valve or air curtain.

The CMP apparatus 1 automatically performs a series of processes including polishing, cleaning, and drying of wafers 11. Unpolished wafers 11 are stored in a pair of cassettes 16. The wafers 11 are taken out from the cassettes 16 and temporarily placed on a provisional rest 18 by the first robot 2. The second robot 4 receives the wafers 11 from the rest 18 and sets them on the loader device 6 which is used as wafer attaching-detaching means.

In the loader device 6, each wafer 11 is attracted to a top ring 20 of the polisher 8 and transferred to a base 22 of the polisher 8, on which an abrasive cloth is pasted, whereupon it is polished. After being polished, the wafer 11 is returned to the loader device 6, and is then delivered to a cleaning-drying device 12 for use as cleaning means by the second robot 4. Arranged in a series in the cleaning-drying device 12 are a first cleaning section 23 for washing the reverse of the polished wafer 11 in pure water, a second cleaning section 24 for washing the obverse of the wafer 11 having being reversed, and a drying section 25 for drying the wafer 11 having being washed on both sides. The dried wafer 11 is restored to its home cassette 16 by the first robot 2.

The following is a detailed description of the respective arrangements of the individual devices.

Figure 3:
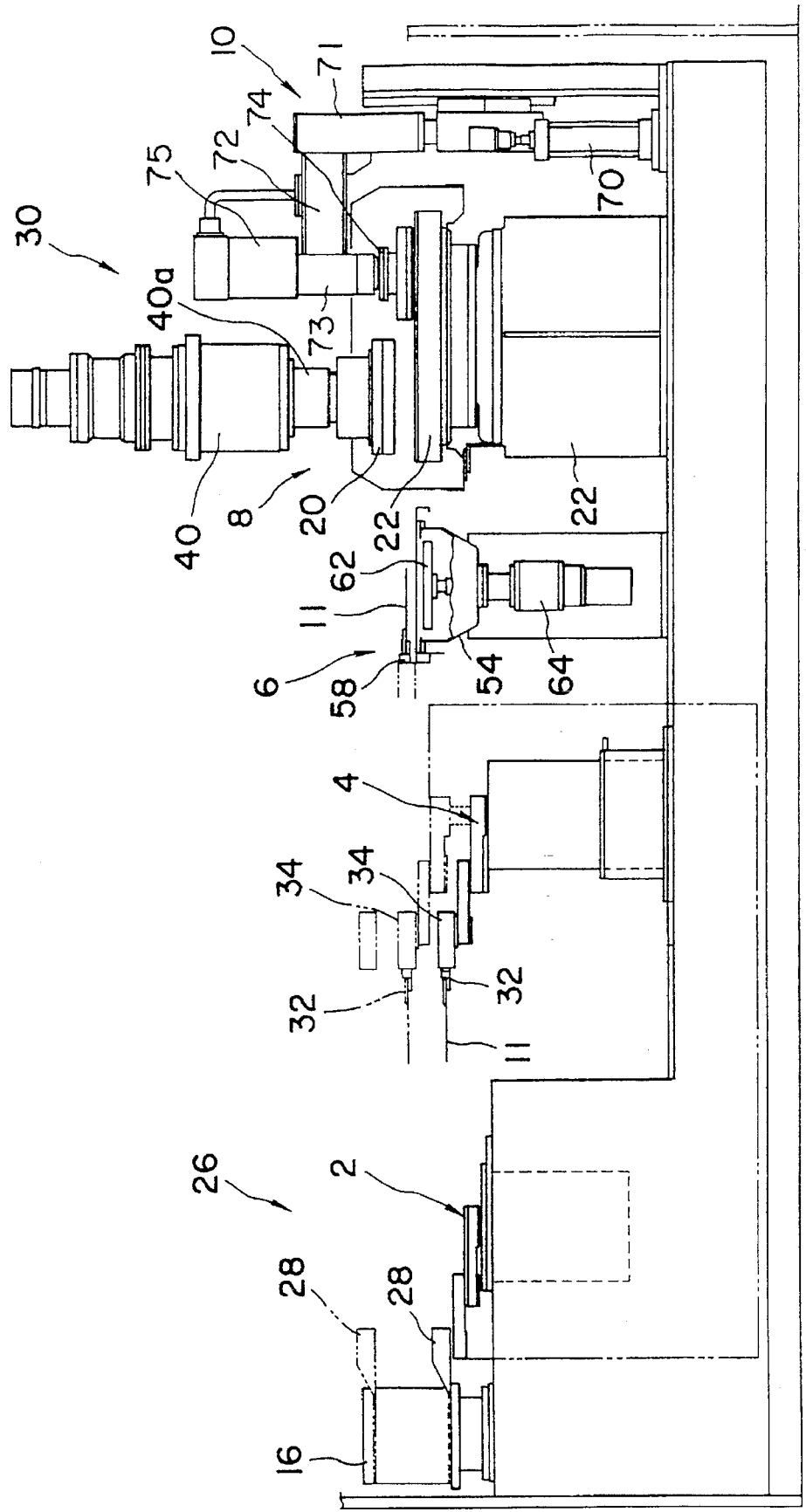
FIG. 3 is a side view of the CMP apparatus.

Referring to FIGS. 2 and 3, the cassettes 16 and the first robot 2 are located in a cassette station 26. The first robot 2 has a hand 28 as an end effector and a multi-joint arm which can move up and down corresponding to the height of a stack of wafers 11 in each cassette 16, as shown in FIG. 3. The provisional rest 18 and the drying section 25 of the cleaning-drying device 12 are arranged within the working range of the first robot 2 so that the wafer 11 can be handled in a dry clean state in the cassette station 26.

The first robot 2 is provided with a pre-aligner (not shown) for locating the delivered wafer 11 in the center of the hand 28 and aligning the wafer 11. To achieve this alignment according to the size of the wafer 11, a sensor attached to the first robot 2 can easily change a detecting position based on the wafer size.

The second robot 4, loader device 6, polisher 8, and dressing device 10 are arranged in a polishing station 30. In this station, the wafer 11 is worked or handled in a wet state.

The loader device 6 and the first cleaning section 23 of the cleaning-drying device 12 are arranged within the working range of the second robot 4. The second robot 4 seizes the wafer 11 on the provisional rest 18 and sets it in the loader device 6. Also, it takes out the polished wafer 11 from the loader device 6, and delivers it to the first cleaning section 23 of the device 12. Like the first robot 2, the second robot 4 is provided with a liftable multi-joint arm, and in particular, a reversal mechanism 34 for rotating a hand 32 for 180° around a horizontal axis. Since the second robot 4 handles the wet wafers after the polishing work, all the sliding parts of the arm have a water- and drip-proof structure.

Figure 4:
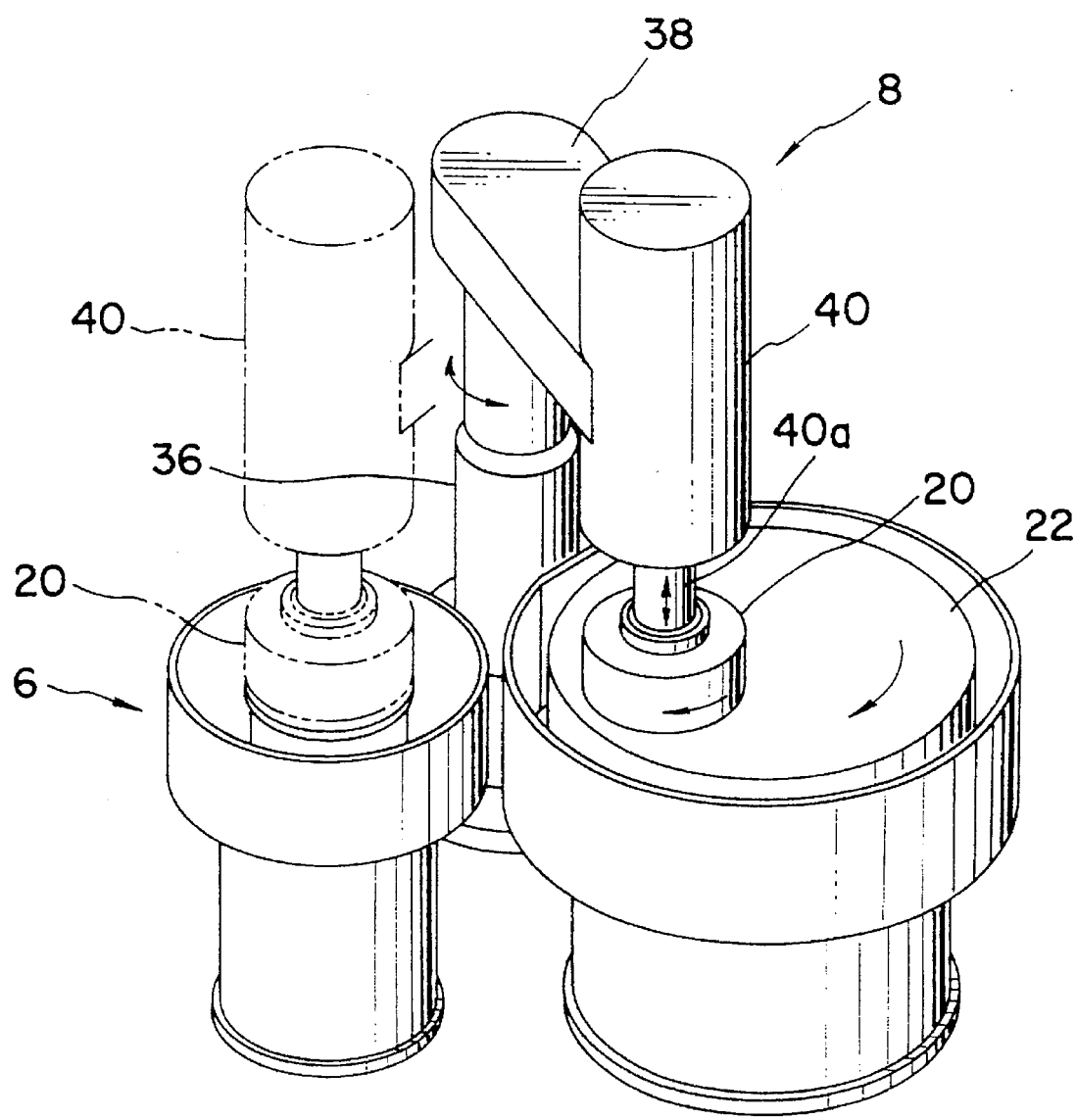
FIG. 4 is a perspective view for illustrating the operation of a polisher.

FIG. 4 shows an arrangement of the polisher 8. The polisher 8 comprises a column 36 set up in the vicinity of the base 22 and the loader device 6, a pivoted arm 38 mounted on the upper end portion of the column 36, and a rotating-lifting mechanism 40 attached to the distal end of the arm 38. The top ring 20 is attached to the lower end portion of the mechanism 40 by means of a rotating-lifting shaft 40a. The ring 20 is connected to the rotating-lifting mechanism 40 so as to be rotated and moved up and down by it. As the pivoted arm 38 swings, moreover, the ring 20 moves between the base 22 and the loader device 6. The wafer 11 is polished on the base 22. In the loader device 6, the wafer 11 is attached or detached, while the top ring 20 is washed.

Figure 5:
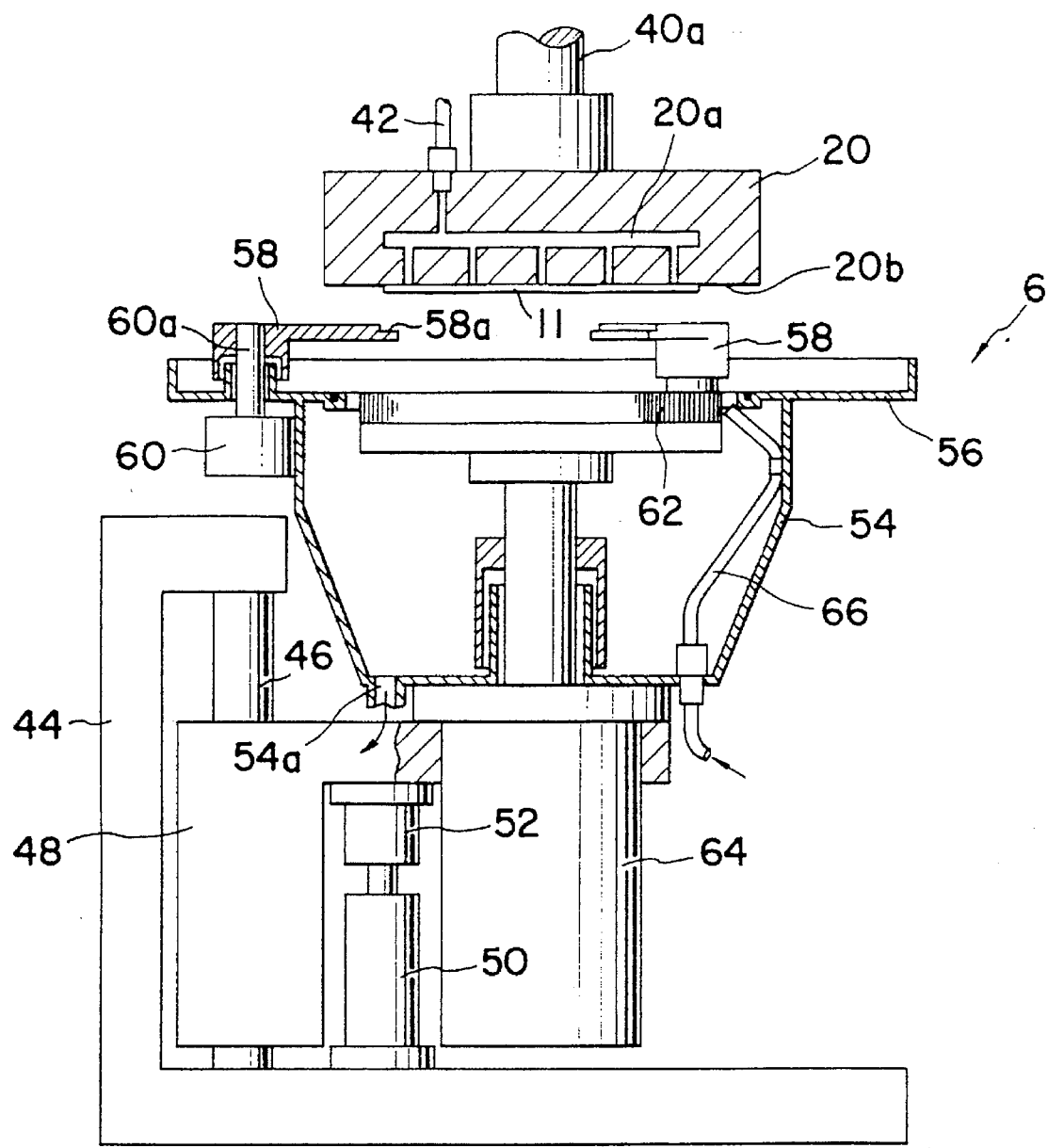
FIG. 5 is a sectional view showing an arrangement of a loader device.

As shown in FIG. 5, a vacuum chamber 20a is defined in the top ring 20. The chamber 20a communicates alternatively with a vacuum source or working air source by means of a tube 42. A wafer attracting face 20b is formed on the underside of the top ring 20. The wafer 11 can be held on the attracting face 20b by the vacuum chuck method using a negative pressure produced in the vacuum chamber 20a.

FIG. 5 is a sectional view showing an arrangement of the loader device 6 in detail. The loader device 6 comprises loader means for attaching to or detaching the wafer 11 from the top ring 20, which is situated in a predetermined position after being moved from the base 22, and cleaning means capable of cleaning the wafer attracting face 20b of the ring 20 in the position for attachment and detachment. Thus, cleaning the attracting face 20b, as well as the attachment and detachment of the wafer 11, can be carried out in the loader device 6. Further, after the surface of the wafer 11 is worked, roughly cleaning the surface of the wafer 11 attached to the attracting face 20 may be carried out in the loader device 6.

The loader device 6 includes a lift member 48 capable of ascending and descending along a guide 46 which is attached to a frame 44. The lift member 48 is movable up and down along the guide 46 as a claw lifting air cylinder 50 or a brush lifting air cylinder 52 moves. The cylinders 50 and 52 are located in series with each other, and have different strokes.

Overlying the lift member 48, a tray-shaped water receiving cover 56 is set on a housing 54 which has a drainage port 54a at the bottom. The loader means and the cleaning means are arranged in- and outside the housing 54 and the cover 56.

The loader means includes three claws 58 which are arranged at regular intervals in the circumferential direction of the water receiving cover 56 so that they can support the wafer 11 in a position substantially on the same level with the wafer attracting face 20b on the underside of the top ring 20 in the position for wafer attachment and detachment. As a rotary actuator 60 for claw rotation is driven, the claws 58 horizontally rotate around a pivot 60a between a wafer supporting position shown in FIG. 1 and a standby position in which the top ring 20 rotated to the outside of the cover 56 is cleaned.

As shown in FIG. 5, a spot-faced portion 58a, which is shaped along the external shape of the wafer 11, is formed on the upper surface portion of the distal end of each claw 58. The spot-faced portions 58a serve to prevent the wafer 11 from being disengaged from the claws 58 when the claws 58 are rotated to the position under the top ring 20 so that the wafer 11 can be attached or detached.

The cleaning means includes a disk-shaped brush 62 which is located in the central portion of the water receiving cover 56, underlying the claws 58. When a brush rotating motor 64 is actuated, the brush 62 is rotated around a vertical axis, thereby cleaning the wafer attracting face 20b of the top ring 20.

Provided in the housing 54 are a desired number of cleaner injection tubes 66 which spray a cleaning agent against the wafer attracting face 20b during the brush cleaning operation.

As shown in FIGS. 2 and 3, a pivoted arm 72 extends horizontally from a body section 71 of the dressing device 10 which is driven to ascend and descend by a cylinder 70. A head 73 is mounted on the arm 72, and a vacuum chuck 74 is attached to the distal end of the head 73. The vacuum chuck 74 can alternatively hold a brush for brushing the abrasive cloth on the base 22 or a conditioning plate which is pasted with diamond pellets for conditioning the abrasive cloth. The conditioning plate may be electrically deposited with diamond powders. The head 73 is provided with a motor 75 for rotating the brush or the conditioning plate.

Arranged within the radius of rotation of the pivoted arm 72, as shown in FIG. 2, are a brushing station 76 on which the brush is placed and a conditioning station 77 on which the conditioning plate is placed.

The cleaning-drying device 12 is located in a cleaning station 80, and its first cleaning section 23 has claws for releasably holding the wafer 11 and includes a support 81 which rotates at high speed. The wafer 11 set on the support 81 is supplied with pure water and cleaned with a brush pressed against it. The first cleaning section 23 is provided with a reversal device 84 which serves to turn the wafer 11 inside out. The reversal device 84 rotates for 180° with the wafer 11 held by means of its supporting portion 85, thereby setting the wafer 11 on a support 82 of the second cleaning section 24.

In the second cleaning section 24, which is constructed in the same manner as the first cleaning section 23, the surface of the wafer 11 is cleaned or washed in pure water with a brush. Both the first and second cleaning sections 23 and 24 can also supply a chemical agent, such as hydrogen fluoride, in order to remove particles and residual metals thoroughly from the wafer 11.

In the drying section 25, a megasonic solution is sprayed on the wafer 11, which is held on a support 83, thereby thoroughly removing the particles from the wafer 11. Thereafter, the wafer 11 is rotated at a high speed of 2,000 rpm or more as it is sprayed with clean nitrogen gas to be dried thereby.

The wafer 11 is transported from the second cleaning section 24 to the drying section 25 by a mobile transfer robot 87 which travels holding the wafer 11 by means of its supporting portion 86.

The following is a description of the operation of the present embodiment.

When the first robot 2 takes out one of the wafers 11 from one of the cassettes 16, the wafer 11 is placed and centered on the hand 28 of the robot 2, and is delivered to the provisional rest 18. The wafer 11 may be taken out by suction by means of a vacuum chuck instead of using the hand 28.

When the second robot 4 receives the wafer 11 from the provisional rest 18, its hand 32 is reversed by the reversal mechanism 34, so that the wafer 11 is reversed and set on the claws 58 of the loader device 6.

When the wafer 11 to be polished next is Supplied from the second robot 4, the claws 58 are situated in an inside rotational position, as shown in FIG. 5. When the wafer 11 is set on the claws 58, the claws 58 ascend and press the wafer 11 against the lower surface of the top ring 20. The ring 20 holds the wafer 11 by vacuum chucking, and the claws 58 descend again. Thereafter, the pivoted arm 38 swings to move the ring 20 to the base 22. When the rotating-lifting mechanism 40 is driven, thereafter, the top ring 20 rotates as it presses the wafer 11 against the abrasive cloth on the upper surface of the base 22, and the wafer 11 is polished with a slurry poured thereon.

When the polishing on the base 22 is finished, the rotating-lifting mechanism 40 is driven, so that the top ring 20 ascends, and the pivoted arm 38 rotates. Thereupon, the top ring 20 moves to the predetermined position for detachment over the loader device 6, as shown in FIG. 4.

The moment before or after the top ring 20 starts to move in this manner, the claws 58 rotate inward, and ascend as the claw lifting air cylinder 50 is stretched. With the claws 58 in the position after the rotation and ascent, their respective spot-faced portions 58a can support the wafer 11 from under the top ring 20.

When a vacuum in the vacuum chamber 20a in the top ring 20 is broken, the wafer 11 is disengaged from the attracting face 20b by means of compressed air fed into the chamber 20a, and is delivered to the claws 58. Thereafter, the claws 58 descend.

When the claws 58, having the wafer 11 thereon, descend to their lower action limits in this manner, the second robot 4 picks up the wafer 11 on the claws 58, and transports them to the first cleaning section 23 of the cleaning-drying device 12, the next station.

Figure 6:
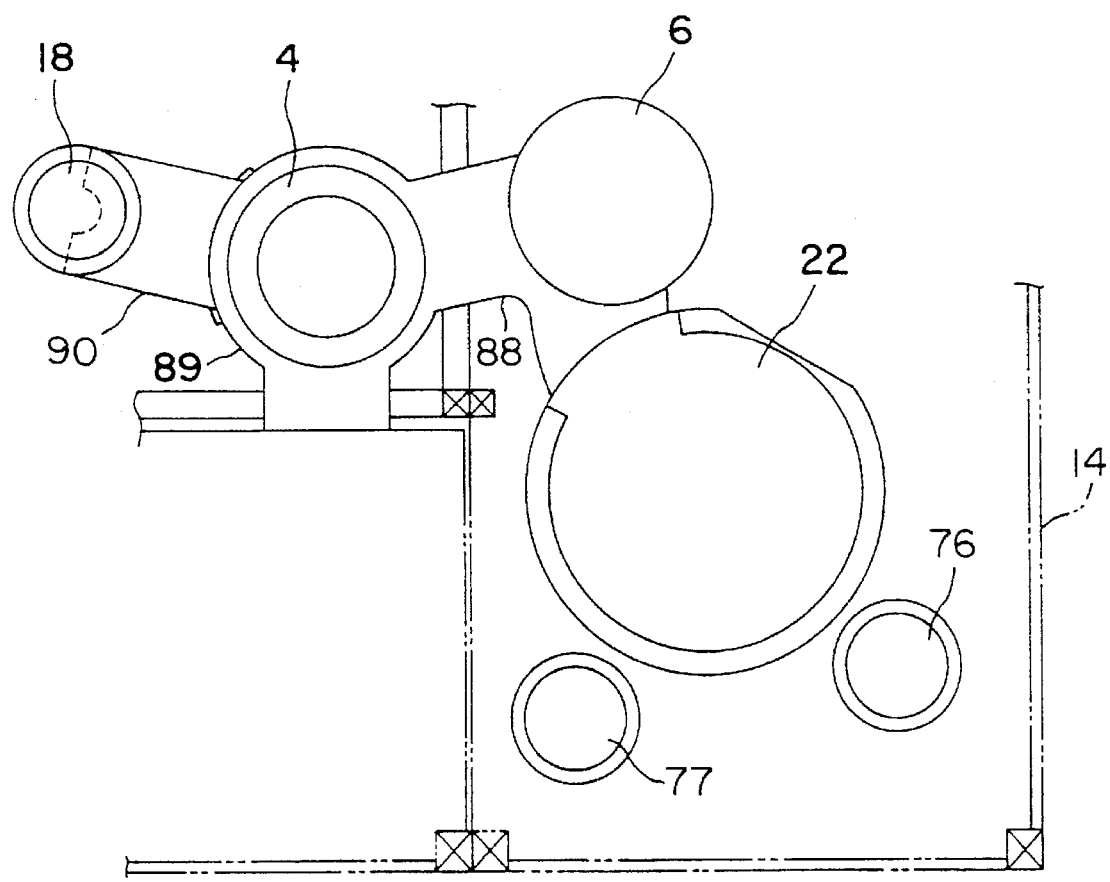
FIG. 6 is a schematic view showing a second robot and gutters arranged along the wafer transfer path of the loader device.

Since the second robot 4 thus handles the wet wafer 11, the wafer 11 drips during the transportation. When the wafer 11 gets dry, particles are inevitably produced. To avoid this, therefore, gutters 88, 89, and 90 are arranged surrounding the working range of the second robot 4, as shown in FIG. 6. Thus, the production of the particles can be prevented by continually pouring water into the gutters.

After delivering the wafer 11 to the cleaning-drying device 12, the claws 58 of the loader device 6 are rotated to the outside standby position by the rotary actuator 60 for claw rotation. As the claws 58 rotate outward, the brush 62 ascends to be ready for brushing. In this case, the brush lifting air cylinder 52 is stretched, so that the brush 62 comes into contact with the attracting face 20b of the top ring 20.

Then, the cleaning agent is sprayed against the lower surface of the top ring 20 from the cleaner injection tubes 66, and the brush 62 is rotated by the brush rotating motor 64, whereby the attracting face 20b of the ring 20 is cleaned.

In the cleaning-drying device 12, on the other hand, the reverse and obverse of the wafer 11 are cleaned in the first and second cleaning sections 23 and 24, respectively. Then, the wafer 11 is transferred to the drying section 25 by the transfer robot 87, whereupon it is dried.

The dried wafer 11 is stored away in the cassette 16 by the first robot 2. When all the wafers 11 in the one cassette 16 are finished being polished, the wafers 11 in the other cassette 16 are beginning to be polished. Naturally, in this case, the working and cleaning conditions may be changed for each cassette.

After the polishing operation is finished, the dressing device 10 pours pure water onto the abrasive cloth on the base 22 while rotating its brush on the base 22, thereby removing the adhering slurry from the cloth. This brushing is carried out while the polisher 8 turned to the loader device 6 is attaching a wafer to or detaching a wafer from the top ring 20 and cleaning the attracting face of the ring 20. Thus, the brushing is prevented from affecting the throughput.

As the polishing is further continued, the slurry on the surface of the abrasive cloth on the base 22 gradually solidifies, so that the polishing speed lowers. To avoid this, the dressing device 10 rotates to the conditioning station 77 after a predetermined number of cycles of polishing are executed continuously. Then, the conditioning plate is attached to the station 77 by means of the vacuum chuck 74, and the abrasive cloth is conditioned to be regenerated. The liming for this conditioning operation can be set in advance in accordance with the working conditions.

In this manner, several wafers 11 continually flow in the working stages, and the individual devices repeat the aforementioned processes of operation. When the second robot 4 delivers the polished wafer 11 to the first cleaning section 23 of the cleaning-drying device 12, for example, the device 12 may malfunction from some cause. In such a case, the second robot 4 operates so as to return the wafer to the loader device 6. As this is done, the claws 58 of the loader device 6 can rotate inward to receive the wafer 11. The wafer 11 on the claws 58 is supplied with pure water from the tubes 66 so that it can be kept wet.

In case the first or second cleaning section 23 or 24 of the cleaning-drying device 12 malfunction, the wafer 11 is transferred to the drying section 25 without being cleaned, and is returned to the cassette 16 after it is dried. In case of any trouble in the drying section 25, on the other hand, the wafer 11 is kept in the first or second cleaning section 23 or 24 so that it is supplied with pure water.

According to the first embodiment of the present invention, as described above, clean dry wafers are handled by means of the multifunctional first transportation means, while wet polished wafers are transported by means of the second transportation means. Thus, all the processes of polishing operation can be performed and efficiently automated without soiling the wafers stored in the cassettes.

Since the loader device is provided with the cleaning means as well as the loader means, moreover, the time required for the movement of the top ring can be shortened, so that the operating efficiency of the polisher can be improved.

According to the first embodiment, furthermore, an appropriate measure is taken to counter diffusion of particles caused by the wafers' dripping during the transportation and the like, so that the CMP apparatus can be installed in a clean room.

Figure 7:
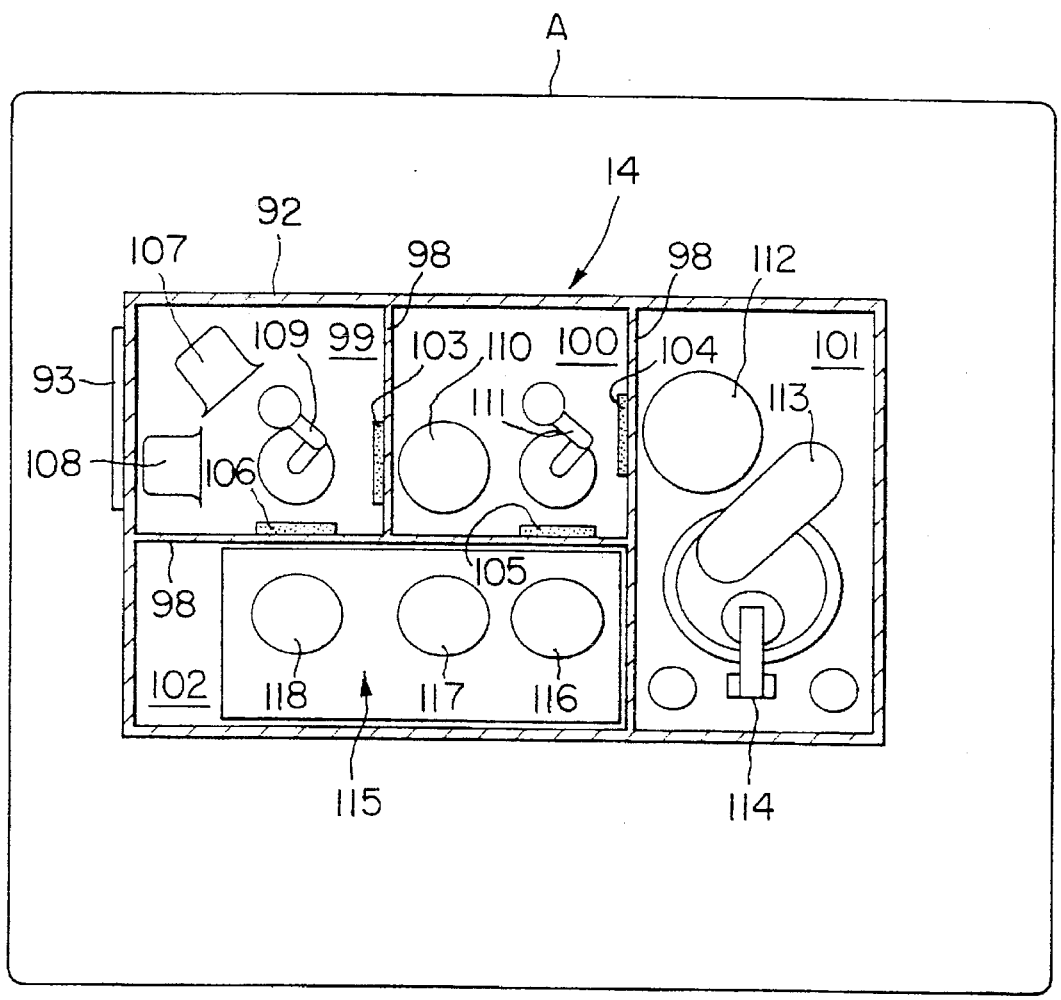
FIG. 7 is a cross-sectional view showing the principal part of a polishing apparatus according to a second embodiment of the invention.
Figure 8:
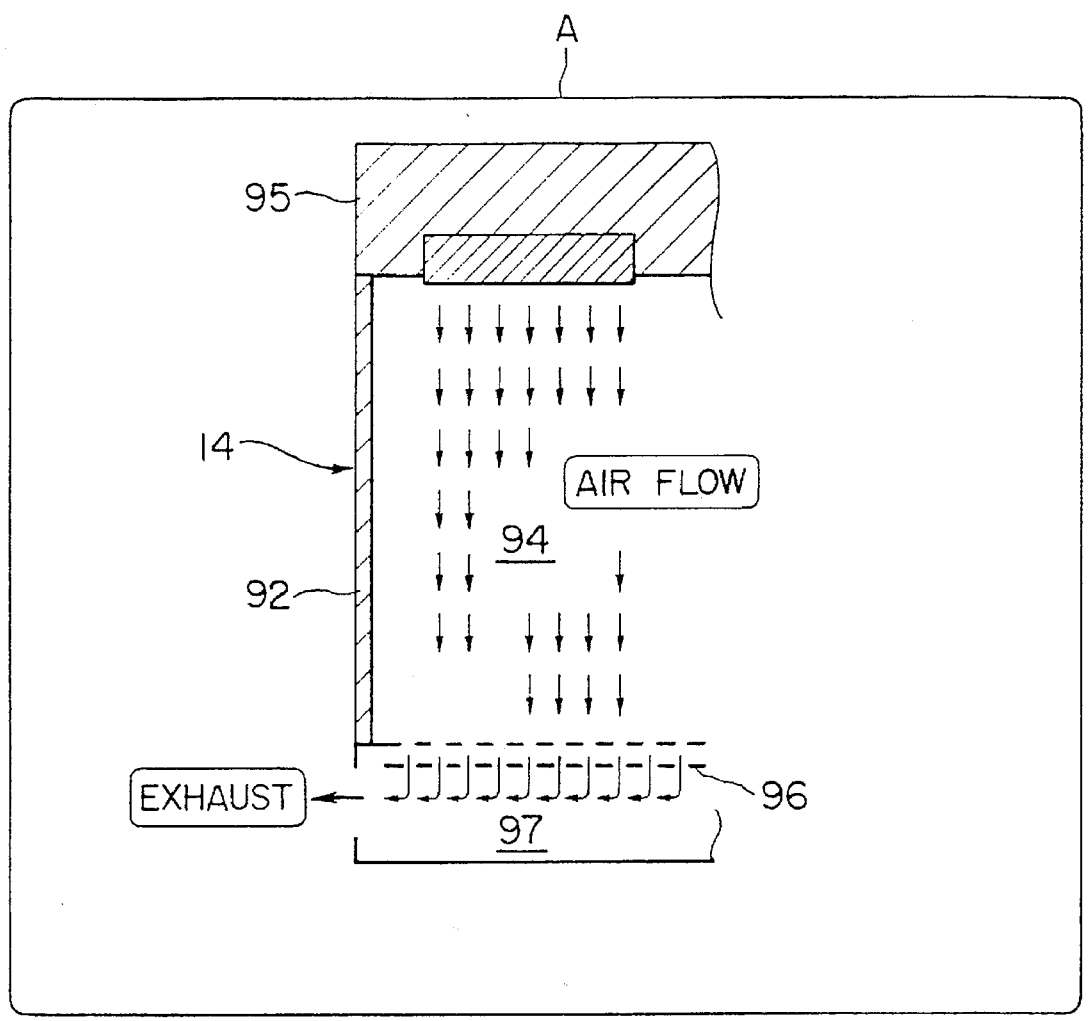
FIG. 8 is a profile showing part of a clean bench according to the second embodiment.

Referring now to FIGS. 7 and 8, a CMP apparatus according to a second embodiment of the present invention will be described.

In FIGS. 7 and 8, numeral 14 denotes a clean bench of the CMP apparatus located in a clean room A. The clean bench 14 has an outer wall 92, which is provided with a door 93 for wafer transfer. The wall 92 and the door 93 make a working chamber 94 in the clean bench 14 airtight. As shown in FIG. 8, a clean unit 95 is provided on top of the clean bench 14, and clean air flows downward from the unit 95. The air flow from the clean unit 95 is introduced into an exhaust area 97 through a laminar flow regulating plate 96 which is located at the lower part of the clean bench 14. The air flow introduced into the exhaust area 97 is discharged to the outside of the clean room A through an exhaust duct (not shown). Instead of using the exhaust duct, the air in the exhaust area 97 may be circulated for reuse in the working chamber 94 of the clean bench 14 after it is cleaned by means of a filter, such as HEPA or ULPA. A combination of the filter of this type and a chemical filter can prevent sodium pollution.

The interior of the working chamber 94 of the clean bench 14 is divided into four compartments 99, 100, 101 and 102, first to fourth, by partition plates 98. The first compartment 99, among these compartments, is formed corresponding to the location of the door 93 for wafer transfer. The respective internal pressures of the four compartments are individually controlled depending on the cleanness by means of an air flow regulator (not shown). Also, the suction pressure of the exhaust area 97 and the air flow in the clean unit 95 are adjusted so that the internal pressures of the compartments are negative as compared with the pressure in the clean room A.

The partition plate 98 between the first and second compartments 99 and 100 is provided with a first gate valve 103. Likewise, the partition plates 98 between the second and third compartments 100 and 101, between the second and fourth compartments 100 and 102, and between the first and fourth compartments 99 and 102 are provided with second, third, and fourth gate valves 104, 105 and 106, respectively. Instead of using these gate valves, air curtains may be used to close apertures which are arranged in the same positions as the valves. Preferably, in this case, the air curtains should be thin air currents which flow along the partition plates at high speed. The use of the air curtains obviates the necessity of moving parts, such as the gate valves, and makes the construction of the apparatus simpler.

The first compartment 99 is provided with first and second wafer carriers 107 and 108 and a first robot 109 for carrying wafers in the first wafer carrier 107 into the second compartment 100. The first robot 109 is also used to deliver the wafers from the fourth compartment into the first compartment 99. The second compartment 100 is provided with a wafer table 110 and a second robot 111 for carrying a wafer on the table 110 into the third compartment 101. The second robot 111 is also used to deliver the wafers from the third compartment 101 into the fourth compartment 102 via the second compartment 100. Further, the third compartment 101 is provided with a loader 112, a polishing device 113 for polishing the wafer received from the loader 112, and a dressing device 114. The fourth compartment 102 is provided with a cleaning-drying device 115 for cleaning and drying the wafer treated in the polishing device 113. The device 115 is composed of a reverse cleaning device 116, an obverse cleaning device 117, and a rinsing-drying device 118.

The pressure in each compartment is controlled in accordance with the cleanness of the compartment during the operation of the CMP apparatus. During the operation of the CMP apparatus, the first and fourth compartments 99 and 102 enjoy the highest cleanness, the second compartment 100 the second highest, and the third compartment 101 the lowest. Since plenty of particles are produced in the third compartment 101, in particular, during the wafer polishing operation, the cleanness of the third compartment 101 is very low. The respective internal pressures of the compartments are controlled so that the higher the cleanness, the higher the pressure.

The following is a description of the operation of the present embodiment.

The first wafer carrier 107, which is carried into the first compartment 99 of the clean bench 14 through the wafer transfer door 93, is stored with a plurality of unworked wafers. One of these wafers is taken out by means of the first robot 109, and the first gate valve 103 is opened. The wafer is carried into the second compartment 100 through the valve 103 and placed on the wafer table 110. Thereafter, the first gate valve 103 is closed.

The first gate valve 103 is thus closed in transferring the wafer from the first compartment 99 to the second compartment 100. Since the pressure in the second compartment 100 is lower than the pressure in the first compartment 99, the air flowing through the first gate valve 103 is directed from the first compartment 99 to the second compartment 100. Thus, there is no possibility of the air in the low-cleanness second compartment 100 flowing into the high-cleanness first compartment 99.

Further, the suction pressure of the exhaust area 97 and the air flow in the clean unit 95 are adjusted so that the internal pressure of the first compartment 99 is negative as compared with the pressure in the clean room A. When the wafer transfer door 93 of the clean bench 14 is opened, therefore, polluted air in the working chamber 94 can never flow out into the clean room A.

Then, the wafer is received from the wafer table 110 by means of the second robot 111, and the second gate valve 104 is opened. The wafer is carried into the third compartment 101 through the valve 104 and delivered to the loader 112. Thereafter, the second gate valve 104 is closed. Even though the second gate valve 104 is opened, the air flow through the valve 104 is directed from the second compartment 100 to the third compartment 101, since the pressure in the third compartment 101 is lower than the pressure in the second compartment 100. Thus, polluted air in the third compartment 101, whose cleanness is very low, can never flow into the second compartment 100.

The wafer is delivered from the loader 112 to the polishing device 113, whereupon it is polished. During the polishing operation, plenty of particles are produced, so that the cleanness of the third compartment 101 lowers. Since a downward flow from the clean unit 95 guides the particles into the exhaust area 97, however, the cleanness of the third compartment 101 is recovered to some degree. The downward flow from the clean unit 95 is provided for the first, second, and fourth compartments 99, 100 and 102, as well as for the third compartment 103. Even in case the cleanness of each compartment is lowered temporarily, therefore, the downward flow can improve the cleanness in some measure.

After the wafer is polished, the second gate valve 104 is opened, and the worked wafer is received by means of the second robot 111. After the second gate valve 104 is closed, the third gate valve 105 is opened, and the wafer is carried into the reverse cleaning device 116 in the fourth compartment 102 through the valve 105. Thereafter, the third gate valve 105 is closed. Even though the third gate valve 105 is opened, the air flow through the valve 105 is directed from the fourth compartment 102 to the second compartment 100, since the pressure in the fourth compartment 102 is higher than the pressure in the second compartment 100. Thus, air in the second compartment 100, whose cleanness is low, can never flow into the fourth compartment 102.

The wafer is cleaned and dried as it is transferred from the reverse cleaning device 116 to the obverse cleaning device 117 and further to the rinsing-drying device 118 by means of a wafer transportation device (not shown) which is provided in the cleaning-drying device 115. Thereafter, the fourth gate valve 106 is opened, and the cleaned and dried wafer is carried into the first compartment 99 by means of the first robot 109. Then, the fourth gate valve 106 is closed, and the wafer is stored away in the second wafer carrier 108.

All the wafers in the first wafer carrier 107 are treated by repeating the aforementioned processes of operation, and are stored in the second wafer carrier 108. Finally, the wafer transfer door 93 is opened, and the second wafer carrier 108 is taken out together with the treated wafers.

According to the second embodiment of the present invention, as described above, the working chamber is divided into a plurality of compartments by means of the partitioning means, and the means for polishing the workpiece is located in one of the compartments. Accordingly, particles are restrained from moving from a low-cleanness compartment, especially the one which contains the polishing means, to a higher-cleanness compartment. Even in the case where the polishing device is set in the clean room, therefore, the particles produced by the operation of the polishing device can be prevented from diffusing into and contaminating the clean room, and therefore, from soiling the clean wafer in the clean bench.

Moreover, the respective internal pressures of a plurality of compartments can be individually controlled depending on the cleanness of each compartment so that the higher the cleanness, the higher the pressure. Even when the compartments communicate with one another, therefore, the air flow between each two adjacent compartments is directed from the compartment with a higher cleanness to the one with a lower cleanness. Accordingly, plenty of particles in a low-cleanness compartment cannot flow into a higher-cleanness compartment. Thus, the particles produced by the operation of the polishing device can be securely prevented from diffusing into and contaminating the clean room, and therefore, from soiling the clean wafer in the clean bench.

Further, the diffusion of the particles can be restrained by air flows which can be produced in the individual compartments. Thus, the particles produced by the operation of the polishing device can be more securely prevented from diffusing into and contaminating the clean room, and therefore, from soiling the clean wafer in the clean bench.

If the air flows are made to be laminar flows, the particles can be restrained from being stirred up, so that the contamination of the clean room and the clean wafer can be securely further prevented.

If the gate valves are used as the communication means, moreover, the connection or disconnection between the compartments can be controlled with high reliability.

If air curtains are used as the communication means, on the other hand, moving parts can be omitted, so that the construction of the apparatus is simpler.

If the means for polishing the workpiece is formed of a device which subjects the workpiece to chemical mechanical polishing, furthermore, the polishing can be effected without involving the diffusion of any particles.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A polishing system comprising:
    a clean bench having compartments therein that are individually pressure-controlled;
    a cassette for storing a wafer to be polished;
    a polishing apparatus for polishing a wafer taken from the cassette;
    a cleaning-drying device for cleaning and drying the polished wafer;
    means for transporting the wafer from the cassette, to the polishing apparatus, to the cleaning-drying device, and then returning the wafer to the cassette, the cassette, polishing apparatus and cleaning-drying device being arranged in respective compartments and separated from an atmosphere external to the clean bench.

2. The polishing system according to claim 1, wherein the polishing apparatus comprises an abrasive cloth.

3. The polishing system according to claim 2, further comprising a dressing device for dressing the abrasive cloth, the dressing device being arranged in the same compartment in which the polishing apparatus is arranged.

4. The polishing system according to claim 3, wherein the dressing device includes:

a brushing station including a brush for brushing the abrasive cloth;
    a conditioning station including a conditioning plate for conditioning the abrasive cloth; and
    a chuck, attached to an arm capable of rotating and moving up and down, for alternately holding the brush or the conditioning plate.

5. The polishing system according to claim 1, wherein the transportation means includes:
    first transportation means for taking the wafer from the cassette and returning it thereto after polishing and cleaning; and
    second transportation means for attaching the wafer taken from the cassette by the first transportation means to the polishing apparatus and for transporting the wafer polished by the polishing apparatus to the cleaning-drying device.

6. The polishing system according to claim 1, wherein a first compartment of the plurality of compartments in which the cassette station is arranged and a second compartment of the plurality of compartments in which the cleaning-drying device is arranged have a cleanness level higher than that of a third compartment of the plurality of compartments in which a polishing apparatus is arranged.

7. The polishing system according to claim 5, wherein the polishing apparatus comprises an arrangement for chemical mechanical polishing.

8. The polishing system according to claim 5 or 7, wherein the first transportation means includes a pre-aligner for centering and aligning the wafer delivered.

9. The polishing apparatus according to claim 5, wherein said second transportation means includes a wafer reversal mechanism.

10. The polishing system according to claim 5, wherein the cleaning-drying device includes:
    a first cleaning section for cleaning a first side of the wafer;
    a reversal device for reversing the wafer cleaned in the first cleaning section;
    a second cleaning section for cleaning a second side of the wafer delivered from the reversal device;
    a transfer robot for taking out and delivering the wafer cleaned in the second cleaning section; and
    a drying section for drying the wafer delivered from the transfer robot.

11. The polishing system according to claim 5, wherein the inlets and outlets of the compartments of the clean bench are partitioned individually by gate valves or air curtains.

12. The polishing system according to claim 5, further comprising:
    pressure means for individually controlling respective internal pressures of the compartments.

13. The polishing system according to claim 5, further comprising air flow means for generating an air flow in each of the compartments.

14. The polishing apparatus according to claim 13, wherein said air flow is a laminar flow.

15. The polishing system according to claim 5, wherein the communication means includes a gate valve.

16. The polishing system according to claim 5, wherein the compartments are divided by an air curtain.

17. The polishing system according to claim 5, wherein the second transportation means includes:

a loader device for attaching the wafer to and from the polishing apparatus; and third transportation means for transporting the wafer taken from the cassette by the first transportation means to the loader device and for transporting the wafer polished by the polishing apparatus from the loader device to the cleaning-drying device.

18. The polishing system according to claim 17, wherein the holder device includes cleaner for cleaning an attracting face of a vacuum-chuck type top ring.

19. The polishing system according to claim 17, wherein a first compartment of the plurality of compartments in which the cassette station is arranged and a second compartment of the plurality of compartments in which the cleaning-drying device is arranged have a cleanness level higher than that of a third compartment of the plurality of compartments in which a loader device is arranged and the cleanness level of the third compartment is higher than a cleanness level of a fourth compartment of the plurality of compartments in which the polishing apparatus is arranged.

20. The polishing system according to claim 5, wherein:
the first transportation means includes a first robot arranged in the compartment in which the cassette station is arranged; and the second transportation means includes a second robot arranged in the compartment in which the polishing apparatus is arranged.

21. The polishing system to claim 1, further comprising attaching-detaching means for attaching the wafer to and detaching the wafer from the polishing apparatus.

* * * * *